(12) United States Patent
Tani (10) Patent No.: US 12,014,974 B2
(45) Date of Patent: Jun. 18, 2024

(54) POWER MODULE WITH ELECTRODES AND HEAT SINK AND MANUFACTURING METHOD THEREFOR

(71) Applicant: Mitsubishi Electric Corporation, Tokyo (JP)

(72) Inventor: Masakazu Tani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 108 days.

(21) Appl. No.: 17/615,206

(22) PCT Filed: Jul. 2, 2019

(86) PCT No.: PCT/JP2019/026294
§ 371 (c)(1),
(2) Date: Nov. 30, 2021

(87) PCT Pub. No.: WO2021/001924
PCT Pub. Date: Jan. 7, 2021

(65) Prior Publication Data
US 2022/0230943 A1  Jul. 21, 2022

(51) Int. Cl.
*H01L 23/495* (2006.01)
*H01L 21/56* (2006.01)
(Continued)

(52) U.S. Cl.
CPC ...... *H01L 23/49575* (2013.01); *H01L 21/565* (2013.01); *H01L 23/4334* (2013.01);
(Continued)

(58) Field of Classification Search
CPC ........... H01L 23/49575; H01L 23/4334; H01L 23/49541; H01L 23/49568; H01L 24/40;
(Continued)

(56) References Cited

U.S. PATENT DOCUMENTS

2005/0082690 A1  4/2005  Hayashi et al.
2007/0042531 A1  2/2007  Hayashi et al.
(Continued)

FOREIGN PATENT DOCUMENTS

EP   2458633 A2   5/2012
EP   2631942 A1   8/2013
(Continued)

OTHER PUBLICATIONS

International Search Report of PCT/JP2019/026294 dated Sep. 10, 2019 [PCT/ISA/210].
(Continued)

*Primary Examiner* — Alonzo Chambliss
(74) *Attorney, Agent, or Firm* — Sughrue Mion, PLLC; Richard C. Turner (57) ABSTRACT

A manufacturing method for a power module capable of shortening a manufacturing time for a power module is obtained. The manufacturing method for a power module includes: a subassembly arranging step of placing a subassembly including a first electrode, a semiconductor device, and a second electrode on a heat sink via a joining material; and a transfer molding step of, after the subassembly arranging step, under a state in which the first electrode, the semiconductor device, and a second-electrode inner portion are arranged in a region surrounded by the heat sink and a molding die, injecting a thermoplastic resin into the region, wherein, in the transfer molding step, the subassembly is joined to the heat sink via the joining material with use of the resin.

13 Claims, 7 Drawing Sheets

(51) Int. Cl.
  *H01L 23/00* (2006.01)
  *H01L 23/433* (2006.01)
  *H01L 25/065* (2023.01)
  *H01L 25/07* (2006.01)
(52) U.S. Cl.
  CPC .. *H01L 23/49541* (2013.01); *H01L 23/49568* (2013.01); *H01L 24/40* (2013.01); *H01L 25/0655* (2013.01); *H01L 25/0657* (2013.01); *H01L 25/072* (2013.01); *H01L 2224/40139* (2013.01); *H01L 2924/181* (2013.01)
(58) Field of Classification Search
  CPC ................. H01L 21/565; H01L 25/072; H01L 2924/181; H01L 23/3107; H01L 25/0655; H01L 25/0657
  See application file for complete search history.

(56) References Cited

U.S. PATENT DOCUMENTS

| | | | | |
|---|---|---|---|---|
| 2010/0007026 | A1* | 1/2010 | Shikano | H01L 25/18 |
| | | | | 257/773 |
| 2012/0038033 | A1 | 2/2012 | Oga et al. | |
| 2014/0376184 | A1* | 12/2014 | Gohara | H05K 7/20254 |
| | | | | 361/689 |
| 2015/0137344 | A1 | 5/2015 | Mori et al. | |
| 2015/0380338 | A1* | 12/2015 | Hori | H01L 25/073 |
| | | | | 257/693 |
| 2020/0381335 | A1 | 12/2020 | Takatsu | |

FOREIGN PATENT DOCUMENTS

| | | |
|---|---|---|
| EP | 3404711 A1 | 11/2018 |
| JP | 2005-123495 A | 5/2005 |
| JP | 2008-270297 A | 11/2008 |
| JP | 2009-212269 A | 9/2009 |
| JP | 2010-153639 A | 7/2010 |
| JP | 2013-030649 A | 2/2013 |
| JP | 2014-93148 A | 5/2014 |
| JP | 2015-099846 A | 5/2015 |
| JP | 6328298 B1 | 5/2018 |
| WO | 2019/082333 A1 | 5/2019 |

OTHER PUBLICATIONS

Extended European Search Report dated Jun. 13, 2022 in European Application No. 19936403.5.
Chinese Office Action dated Apr. 27, 2024 in Application No. 201980097730.9.

* cited by examiner

POWER MODULE WITH ELECTRODES AND HEAT SINK AND MANUFACTURING METHOD THEREFOR

CROSS REFERENCE TO RELATED APPLICATIONS

This application is a National Stage of International Application No. PCT/JP2019/026294 filed on Jul. 2, 2019.

TECHNICAL FIELD

This invention relates to a power module and a manufacturing method therefor.

BACKGROUND ART

Hitherto, there has been known a power module in which a resin portion is provided around a subassembly including a first substrate, a semiconductor substrate, and a second substrate superposed in the stated order, and in which the first substrate is joined to a heat sink via a joining material. The power module is manufactured by a manufacturing method for a power module including a transfer molding step and a heat sink joining step which is performed after the transfer molding step. In the transfer molding step, under a state in which the subassembly is arranged on an inner side of a molding die, a thermoplastic resin is injected into an inner side of the molding die. In the heat sink step, the first substrate is joined to the heat sink via the joining material (see, for example, Patent Literature 1).

CITATION LIST

Patent Literature

[PTL 1] JP 6328298 B

SUMMARY OF INVENTION

Technical Problem

However, after each of the transfer molding step and the heat sink joining step, a curing step is required. As a result, there has been a problem in that a manufacturing time for the power module becomes longer.

This invention has been made to solve the above-mentioned problem, and has an object to provide a power module and a manufacturing method therefor which are capable of shortening the manufacturing time for the power module.

Solution to Problem

According to this invention, there is provided a power module, including: a subassembly including: a first electrode; a semiconductor device joined to the first electrode; and a second electrode joined to the semiconductor device; a heat sink to which the subassembly is joined via a joining material; and a resin portion molded integrally with the first electrode, the semiconductor device, a second-electrode inner portion being a portion of the second electrode joined to the semiconductor device, and the heat sink.

According to this invention, there is provided a manufacturing method for a power module, including: a subassembly arranging step of placing a subassembly including a first electrode, a semiconductor device joined to the first electrode, and a second electrode joined to the semiconductor device on a heat sink via a joining material; and a transfer molding step of injecting, after the subassembly arranging step, under a state in which the first electrode, the semiconductor device, and a second-electrode inner portion being a portion of the second electrode joined to the semiconductor device are arranged in a region surrounded by the heat sink and a molding die, a thermoplastic resin into the region, wherein, in the transfer molding step, the subassembly is joined to the heat sink via the joining material with use of the resin.

Advantageous Effects of Invention

According to the power module and the manufacturing method therefor of this invention, the manufacturing time for the power module can be shortened.

DESCRIPTION OF EMBODIMENTS

First Embodiment

Figure 1:
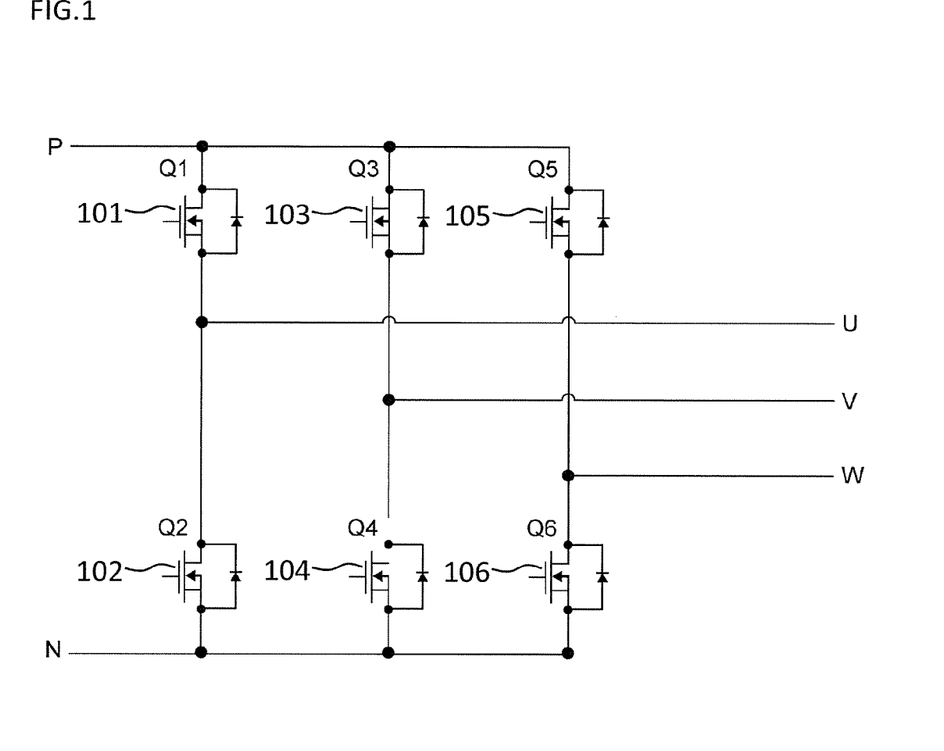
FIG. 1 is a circuit diagram for illustrating a main part of a power conversion apparatus including a power module according to a first embodiment of this invention.

FIG. 1 is a circuit diagram for illustrating a main part of a power conversion apparatus including a power module according to a first embodiment of this invention. The power conversion apparatus includes a switching circuit for controlling electric power. Examples of the power conversion apparatus include a motor driving inverter to be mounted to an electric vehicle, a voltage reducing converter for converting a voltage from a high voltage to a low voltage, and a power charger to be connected to external power source equipment to charge an on-vehicle battery.

FIG. 1 shows a motor driving inverter. The motor driving inverter includes a U-phase switching circuit, a V-phase switching circuit, and a W-phase switching circuit. The U-phase switching circuit includes a U-phase upper arm 101 and a U-phase lower arm 102. The V-phase switching circuit includes a V-phase upper arm 103 and a V-phase lower arm 104. The W-phase switching circuit includes a W-phase upper arm 105 and a W-phase lower arm 106.

The U-phase upper arm 101, the U-phase lower arm 102, the V-phase upper arm 103, the V-phase lower arm 104, the W-phase upper arm 105, and the W-phase lower arm 106 are each formed of a semiconductor device. Examples of the semiconductor device include a metal-oxide-semiconductor field-effect transistor (MOS-FET), an insulated gate bipolar transistor (IGBT), and a diode. As a base material of the semiconductor device, there are used silicon, silicon nitride, and gallium nitride.

In order to achieve a larger capacity of the power conversion apparatus, a plurality of semiconductor devices are connected in parallel in the power conversion apparatus. Further, due to limitation on a manufacture yield of a base material of the semiconductor device, a plurality of semiconductor devices each having a small outer-shape size are used for the power conversion apparatus.

Figure 2:
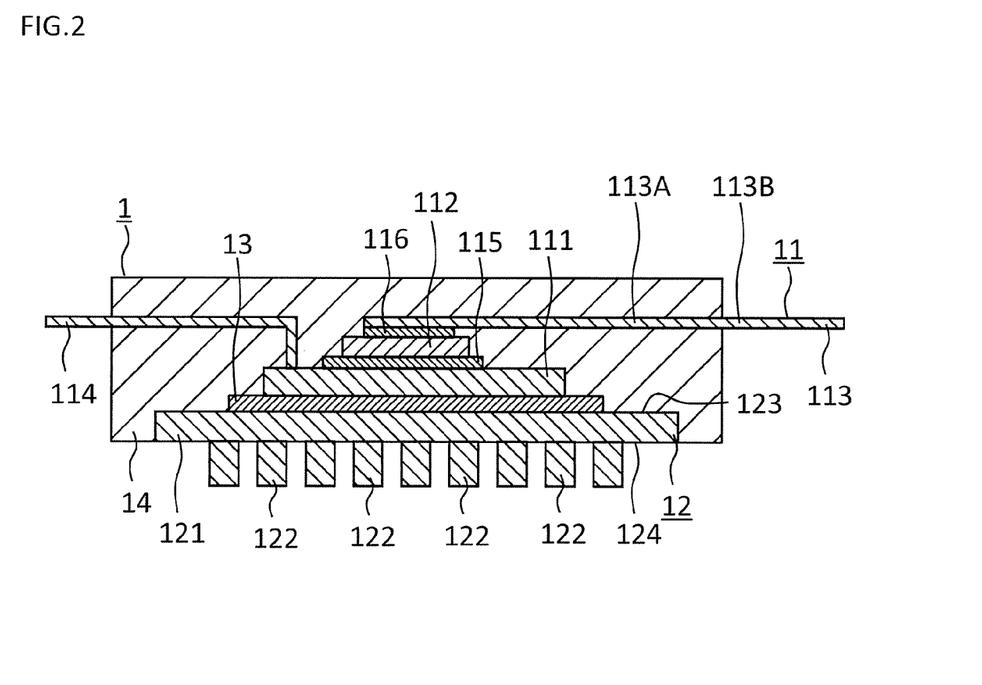
FIG. 2 is a sectional view for illustrating a main part of the power module according to the first embodiment of this invention.

FIG. 2 is a sectional view for illustrating a main part of the power module according to the first embodiment of this invention. A power module 1 includes a subassembly 11, a heat sink 12, a joining material 13, and a resin portion 14.

Figure 3:
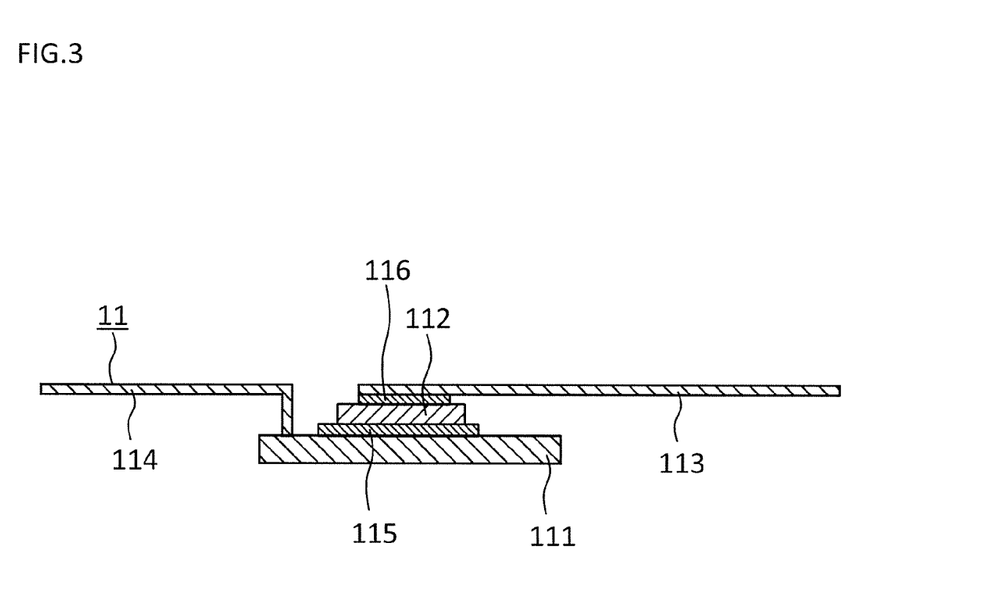
FIG. 3 is a sectional view for illustrating a subassembly of FIG. 2.

FIG. 3 is a sectional view for illustrating the subassembly 11 of FIG. 2. The subassembly 11 includes a first electrode 111, a semiconductor device 112, a second electrode 113, and a third electrode 114. Further, the subassembly 11 includes a first joining material 115 and a second joining material 116.

The semiconductor device 112 has a flat-plate shape. The semiconductor device 112 is joined to the first electrode 111 via the first joining material 115 under a state in which one surface of the semiconductor device 112 is opposed to the first electrode 111. Examples of the first joining material 115 include solder. The semiconductor device 112 is joined to the first electrode 111 by die-bonding.

The semiconductor device 112 is joined to the second electrode 113 via the second joining material 116 under a state in which the other surface of the semiconductor device 112 is opposed to the second electrode 113. Examples of the second joining material 116 include solder. The semiconductor device 112 and the second electrode 113 may be joined to each other by wire bonding. The third electrode 114 is joined to the first electrode 111 with use of solder.

As illustrated in FIG. 2, the resin portion 14 covers the first electrode 111, the semiconductor device 112, and a portion of the second electrode 113 joined to the semiconductor device 112. The portion of the second electrode 113 joined to the semiconductor device 112 is a second-electrode inner portion 113A. Thus, the second-electrode inner portion 113A is covered by the resin portion 14. A portion of the second electrode 113 arranged on an outer side of the resin portion 14 is a second-electrode outer portion 113B. The second-electrode outer portion 113B extends along the semiconductor device 112 from a side surface of the resin portion 14. The second-electrode outer portion 113B extends in a direction perpendicular to the side surface of the resin portion 14 from the side surface of the resin portion 14.

The resin portion 14 covers one end portion of the third electrode 114. The other end portion of the third electrode 114 is arranged on an outer side of the resin portion 14. The other end portion of the third electrode 114 extends along the semiconductor device 112 from a side surface of the resin portion 14. The other end portion of the third electrode 114 extends in a direction perpendicular to the side surface of the resin portion 14 from the side surface of the resin portion 14.

The subassembly 11 is joined to the heat sink 12 via the joining material. The heat sink 12 includes a flat-plate portion 121 and a plurality of heat-radiation fins 122. The flat-plate portion 121 has the subassembly 11 placed thereon via the joining material 13. The plurality of heat-radiation fins 122 are provided to the flat-plate portion 121. The flat-plate portion 121 has a first surface 123 and a second surface 124 facing a side opposite to the first surface 123. The first surface 123 has the subassembly 11 placed thereon via the joining material 13. The second surface 124 has the heat-radiation fins 122 provided thereon.

In this example, description is made of a configuration in which the subassembly 11 including one semiconductor device 112 is placed on one heat sink 12. There may also be provided a configuration in which the subassembly 11 including a plurality of semiconductor devices 112 is placed on one heat sink 12. Specifically, there may also be provided a configuration in which the subassembly 11 including two semiconductor devices 112 is placed on one heat sink 12 or a configuration in which the subassembly 11 including six semiconductor devices 112 is placed on one heat sink 12.

The first electrode 111 is joined to the flat-plate portion 121 of the heat sink 12 via the joining material 13. The joining material 13 has an insulating property. The joining material 13 is a resin composition obtained by impregnating a base material with a thermosetting resin, and is a resin composition semi-cured by drying. Examples of the base material of the joining material 13 include a fibrous reinforced material and a ceramic sintered body. Examples of the thermosetting resin impregnated into the base material of the joining material 13 include an epoxy resin. The joining material 13 has a film-like shape or a sheet-like shape. The term "semi-cured" corresponds to a state before the thermosetting resin is completely cured. In this example, description is made of a configuration in which an adhesive sheet is used as the joining material 13.

The resin portion 14 is molded integrally with the first electrode 111, the semiconductor device 112, the second-electrode inner portion 113A, and the heat sink 12. Further, the resin portion 14 is molded integrally with the first surface 123 and a side surface of the heat sink 12. The resin portion 14 covers a part of the heat sink 12.

Figure 4:
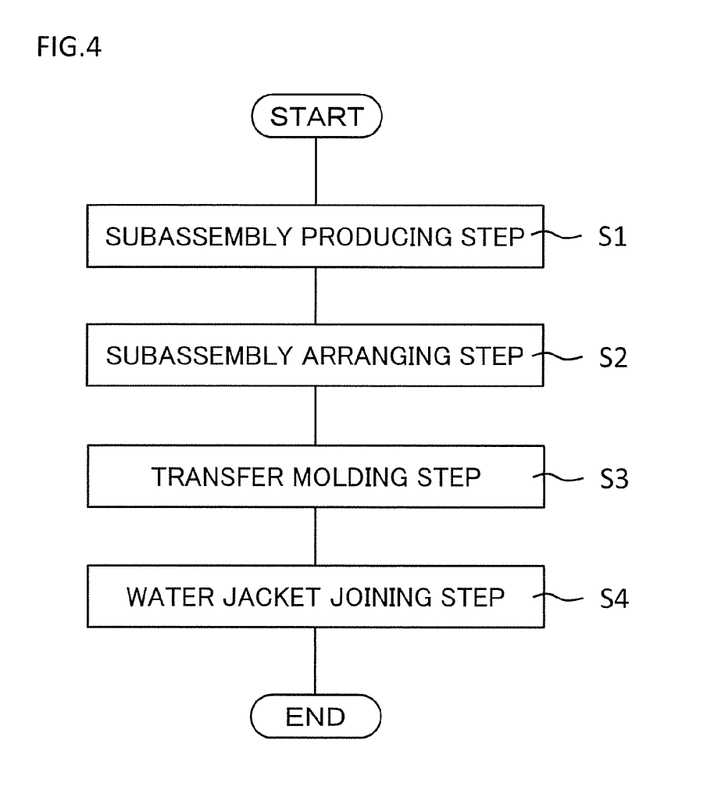
FIG. 4 is a flowchart for illustrating a procedure for manufacturing the power module of FIG. 2.

Next, a manufacturing method for the power module 1 is described. FIG. 4 is a flowchart for illustrating a procedure for manufacturing the power module 1 of FIG. 2. First, in Step S1, a subassembly producing step is performed. In the subassembly producing step, the semiconductor device 112 is joined to the first electrode 111, the second electrode 113 is joined to the semiconductor device 112, and the third electrode 114 is joined to the first electrode 111. In such a manner, the subassembly 11 is produced.

Figure 5:
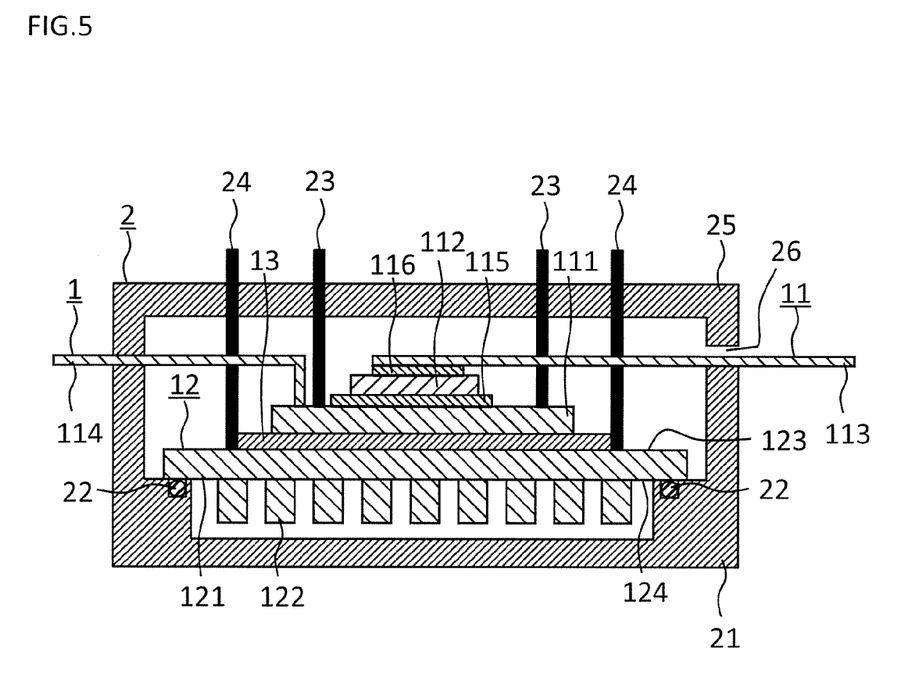
FIG. 5 is a sectional view for illustrating a state in which the subassembly, a joining material, and a heat sink of FIG. 2 are arranged on an inner side of a molding die.

After that, in Step S2, a subassembly arranging step is performed. FIG. 5 is a sectional view for illustrating a state in which the subassembly 11, the joining material 13, and the heat sink 12 of FIG. 2 are arranged on an inner side of a molding die. In the subassembly arranging step, the heat sink 12 is arranged on a lower die 21 of a molding die 2, and a first sealing member 22 is arranged between a peripheral edge portion of the second surface 124 of the flat-plate portion 121 of the heat sink 12 and the lower die 21 so as to prevent a resin from flowing to a periphery of the heat-radiation fins 122. In such a manner, a part between the peripheral edge portion of the second surface 124 and the molding die 2 is sealed. Further, in the subassembly arranging step, the subassembly 11 is placed on the first surface 123 of the flat-plate portion 121 of the heat sink 12 via the joining material 13. At this time, the first electrode 111 is superposed on the heat sink 12 via the joining material 13.

Further, in the subassembly arranging step, a plurality of first pins 23 push the first electrode 111 toward the heat sink 12. As a result, the first electrode 111 is positioned with respect to the heat sink 12, and the first sealing member 22 ensures the air tightness between the heat sink 12 and the lower die 21.

Further, in the subassembly arranging step, second pins 24 abut against at least two or more pin abutment portions formed on the joining material 13. As a result, the joining material 13 is positioned with respect to the heat sink 12. At this time, the two or more pin abutment portions provided on the joining material 13 are two or more side surfaces formed on the joining material 13. The side surfaces of the joining material 13 which serve as the pin abutment portions may be, for example, side surfaces of the joining material 13 formed by chamfering corner portions of the joining material 13 having a quadrangular shape before being processed. The joining material 13 having a quadrangular shape before being processed corresponds to the joining material 13 having a quadrangular shape when the joining material 13 is viewed in a direction perpendicular to an upper surface of the joining material 13. The two or more pin abutment portions of the joining material 13 may be two or more holes formed in the joining material 13.

Further, in the subassembly arranging step, an upper die 25 is placed on the lower die 21. At this time, a part of the second electrode 113 and a part of the third electrode 114 are arranged on an outer side of the molding die 2 through a gap defined between the lower die 21 and the upper die 25. As a result, the first electrode 111, the semiconductor device 112, and the second-electrode inner portion 113A are arranged in a region surrounded by the heat sink 12 and the molding die 2.

After that, as illustrated in FIG. 4, in Step S3, a transfer molding step is performed. In the transfer molding step, the molding die 2 is heated until a temperature of the molding die 2 reaches a set temperature. Further, in the transfer molding step, the thermoplastic resin is pressurized until the thermoplastic resin reaches a set pressure. Under a state in which the temperature of the molding die 2 has reached the set temperature, and the thermoplastic resin has reached the set pressure, the thermoplastic resin passes through a gate 26 of the molding die 2 to be injected into an inner side of the molding die 2.

In the transfer molding step, the pressure of the resin injected into the inner side of the molding die 2 causes the first electrode 111 to be pushed against the heat sink 12 via the joining material 13. As a result, air bubbles included in the joining material 13 are removed from the joining material 13. Further, in the transfer molding step, heat of the resin injected into the inner side of the molding die 2 causes the first electrode 111 and the heat sink 12 to be joined to each other via the joining material 13. Removal of the air bubbles included in the joining material 13 improves a heat radiating property and an insulating property of the joining material 13. The resin portion 14 is molded integrally with the first electrode 111, the semiconductor device 112, the second-electrode inner portion 113A, and the heat sink 12 by the transfer molding step.

Figure 6:
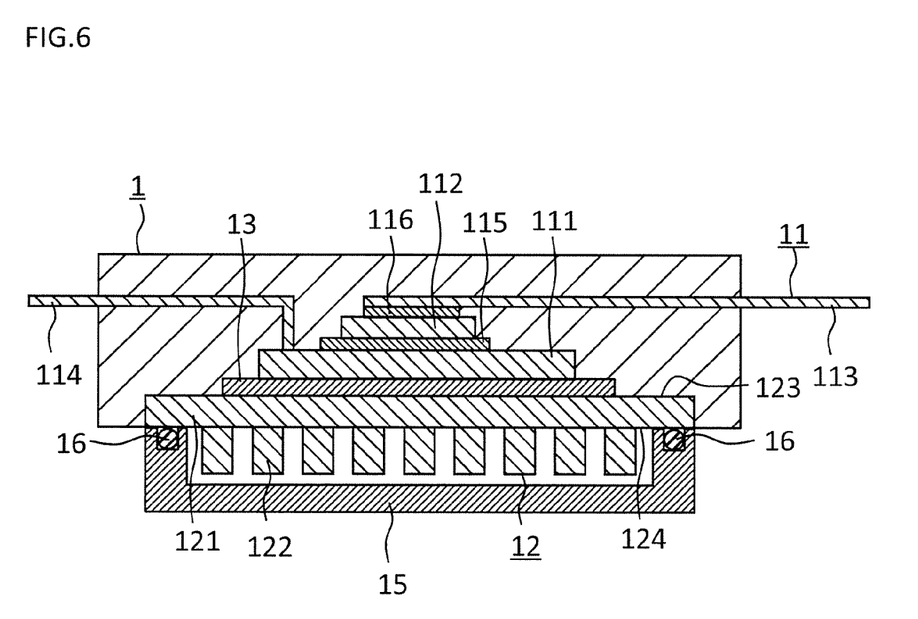
FIG. 6 is a sectional view for illustrating a state in which a water jacket is joined to the heat sink of FIG. 2.

After that, in Step S4, a water jacket joining step is performed. FIG. 6 is a sectional view for illustrating a state in which a water jacket is joined to the heat sink 12 of FIG. 2. In the water jacket joining step, a water jacket 15 is joined to the heat sink 12. The water jacket 15 is included in the power module 1.

A water passage through which a coolant to be used for forcible water cooling flows is formed around the heat-radiation fins 122 of the heat sink 12 by the water jacket joining step. Examples of a method of joining the heat sink 12 and the water jacket 15 to each other include welding and friction agitation joining. Further, a second sealing member 16 is arranged between the heat sink 12 and the water jacket 15. In such a manner, a part between the heat sink 12 and the water jacket 15 is sealed. The second sealing member 16 is included in the power module 1. Examples of the second sealing member 16 include an O-ring or a liquid packing. After the processes described above, the step for manufacturing the power module 1 is terminated.

Figure 7:
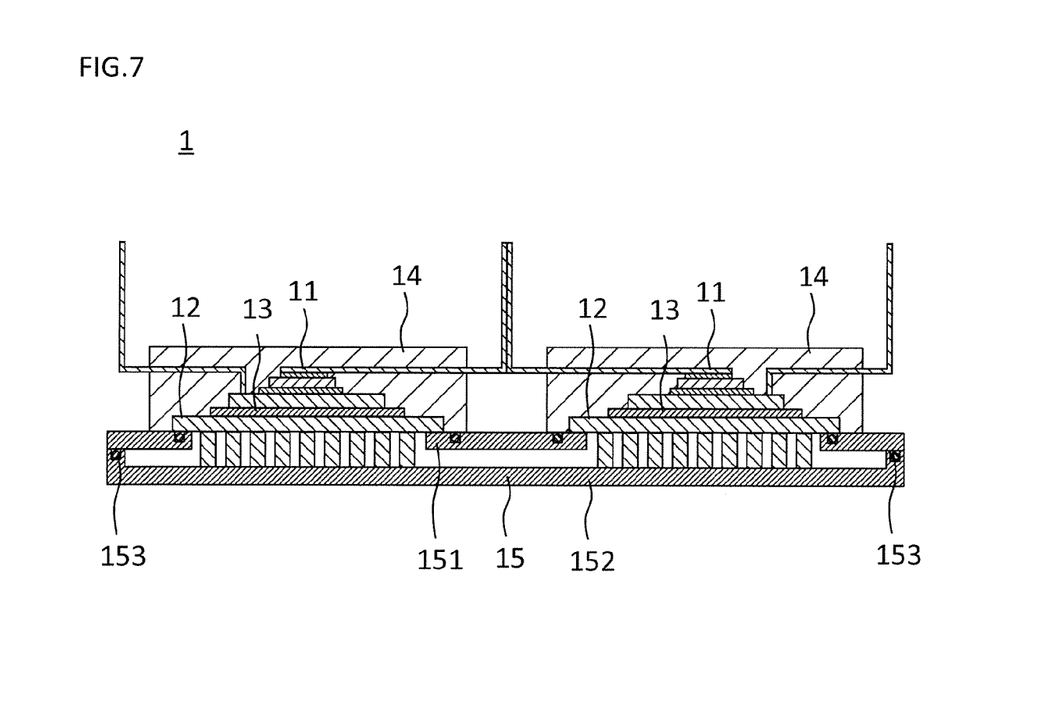
FIG. 7 is a sectional view for illustrating a modification example of the power module of FIG. 6.

FIG. 7 is a sectional view for illustrating a modification example of the power module 1 of FIG. 6. In FIG. 6, illustration is given of the configuration in which one water jacket 15 is joined to one heat sink 12. However, as illustrated in FIG. 7, there may be provided a configuration in which one water jacket 15 is joined to two heat sinks 12. In this case, the water jacket 15 includes a frame 151, a tub portion 152, and a third sealing member 153. The frame 151 has two through holes. The tub portion 152 is joined to the frame 151. The third sealing member 153 is provided between the frame 151 and the tub portion 152. The third sealing member 153 seals a part between the frame 151 and the tub portion 152. In the water jacket joining step, under a state in which the two heat sinks 12 are inserted into the two through holes of the frame 151, respectively, each of the two heat sinks 12 and the water jacket 15 are joined to each other.

Figure 8:
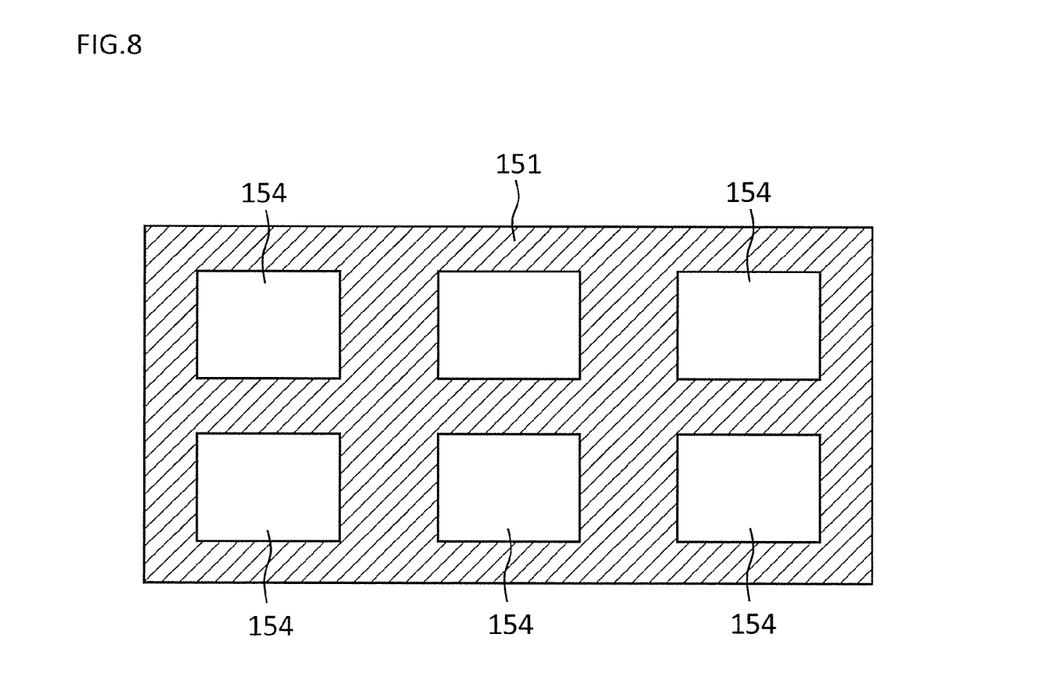
FIG. 8 is a plan view for illustrating a modification example of a frame of FIG. 7.

The number of the heat sinks to be joined to one water jacket is not limited to two, and may be three or more. FIG. 8 is a plan view for illustrating a modification example of the frame 151 of FIG. 7. When one water jacket 15 is to be joined to six heat sinks 12, the frame 151 has six through holes 154.

As described above, in the manufacturing method for the power module 1 according to the first embodiment of this invention, in the transfer molding step, the subassembly 11 is joined to the heat sink 12 via the joining material 13 with use of the resin injected into the inner side of the molding die 2. In a related-art manufacturing method for a power module, the heat sink joining step of joining the subassembly 11 and the heat sink 12 to each other is a step separate from the transfer molding step. Thus, in the related-art manufacturing method for a power module, after each of the transfer molding step and the heat sink joining step, a curing step is required. As a result, a manufacturing time for the power module becomes longer. Meanwhile, in the manufacturing method for the power module 1 according to the first embodiment, the subassembly 11 and the heat sink 12 are joined to each other by the transfer molding step. In other words, the transfer molding step and the heat sink joining step are performed at the same time. Therefore, the curing step is performed once. As a result, the manufacturing time for the power module 1 can be shortened. Further, equipment for the heat sink joining step is not required. As a result, manufacturing equipment for the power module 1 can be simplified. Further, in the power module 1 according to the first embodiment of this invention, the resin portion 14 is formed integrally with the heat sink 12. Accordingly, when the resin portion 14 is formed, the subassembly 11 is joined to the heat sink 12 via the joining material 13. As a result, the manufacturing time for the power module 1 can be shortened.

Further, in the manufacturing method for the power module 1 according to the first embodiment of this invention, in the transfer molding step, the subassembly 11 is joined to the heat sink 12 via the joining material 13 with use of the resin injected into the inner side of the molding die 2. In the related-art manufacturing method for a power module, the heat sink joining step is performed after the transfer molding step. Thus, in the related-art manufacturing method for a power module, pressure and heat applied to the subassembly 11 in the heat sink joining step may cause separation between the first electrode 111 and the semiconductor device 112 or between the second electrode 113 and the semiconductor device 112. Thus, in the related-art manufacturing method for a power module, in the heat sink joining step, the pressure cannot be applied to the joining material 13 in such a manner that air bubbles included in the joining material 13 are removed from the joining material 13. As a result, with the related-art manufacturing method for a power module, the heat radiating property and the insulating property of the joining material 13 are lowered. Meanwhile, with the manufacturing method for the power module 1 according to the first embodiment, the pressure can be applied to the joining material 13 with use of the pressure of the resin injected into the inner side of the molding die 2. Thus, occurrence of the separation between the first electrode 111 and the semiconductor device 112 or between the second electrode 113 and the semiconductor device 112 can be prevented, and the heat radiating property and the insulating property of the joining material 13 can be improved. As a result, the reliability of the power module 1 can be improved. Further, in the power module 1 according to the first embodiment of this invention, the resin portion 14 is formed integrally with the heat sink 12. Accordingly, when the resin portion 14 is formed, the subassembly 11 is joined to the heat sink 12 via the joining material 13. Accordingly, the pressure is applied to the joining material 13 when the resin portion 14 is formed. Thus, occurrence of the separation between the first electrode 111 and the semiconductor device 112 and between the second electrode 113 and the semiconductor device 112 can be prevented, and the heat radiating property and the insulating property of the joining material 13 can be improved. As a result, the reliability of the power module 1 can be improved.

Further, in the manufacturing method for the power module 1 according to the first embodiment of this invention, in the transfer molding step, a part of the heat sink 12 is covered by the resin portion 14. In the related-art manufacturing method for a power module, the heat sink 12 is not covered by the resin portion 14. In other words, the heat sink 12 is not joined to the resin portion 14. Thus, in the related-art manufacturing method for a power module, stress may act on the joining material 13 at the time of fluctuation in environmental temperature due to a difference in a linear expansion coefficient between the subassembly 11 and the heat sink 12 to cause separation between the joining material 13 and the subassembly 11 or between the joining material 13 and the heat sink 12. As a result, in the related-art manufacturing method for a power module, the heat radiating property and the insulating property of the power module 1 are poor. Meanwhile, in the manufacturing method for the power module 1 according to the first embodiment, in the transfer molding step, a part of the heat sink 12 is covered by the resin portion 14. Accordingly, the heat sink 12 is joined to the resin portion 14. Thus, the stress which acts on the joining material 13 at the time of fluctuation in the environmental temperature is reduced. Accordingly, occurrence of the separation between the joining material 13 and the subassembly 11 or the heat sink 12 can be prevented. As a result, the heat radiating property and the insulating property of the power module 1 can be improved. Further, in the power module 1 according to the first embodiment of this invention, the resin portion 14 is formed integrally with the heat sink 12. Thus, the stress which acts on the joining material 13 at the time of fluctuation in the environmental temperature is reduced. Accordingly, occurrence of the separation between the joining material 13 and the subassembly 11 or the heat sink 12 can be prevented. As a result, the heat radiating property and the insulating property of the power module 1 can be improved.

Further, in the manufacturing method for the power module 1 according to the first embodiment, in the transfer molding step, a part of the heat sink 12 is covered by the resin portion 14. In the related-art manufacturing method for a power module, in the transfer molding step, the heat sink 12 is not covered by a resin. Thus, in the related-art manufacturing method for a power module, in order to increase the stiffness of the heat sink 12, it is required to increase the thickness of the heat sink 12. Meanwhile, in the manufacturing method for the power module 1 according to the first embodiment, in the transfer molding step, a part of the heat sink 12 is covered by the resin portion 14. Accordingly, the stiffness of the heat sink 12 can be increased without increasing the thickness of the heat sink 12. Further, in the power module 1 according to the first embodiment of this invention, the resin portion 14 is formed integrally with the heat sink 12. The stiffness of the heat sink 12 can be increased without increasing the thickness of the heat sink 12.

Second Embodiment

Figure 9:
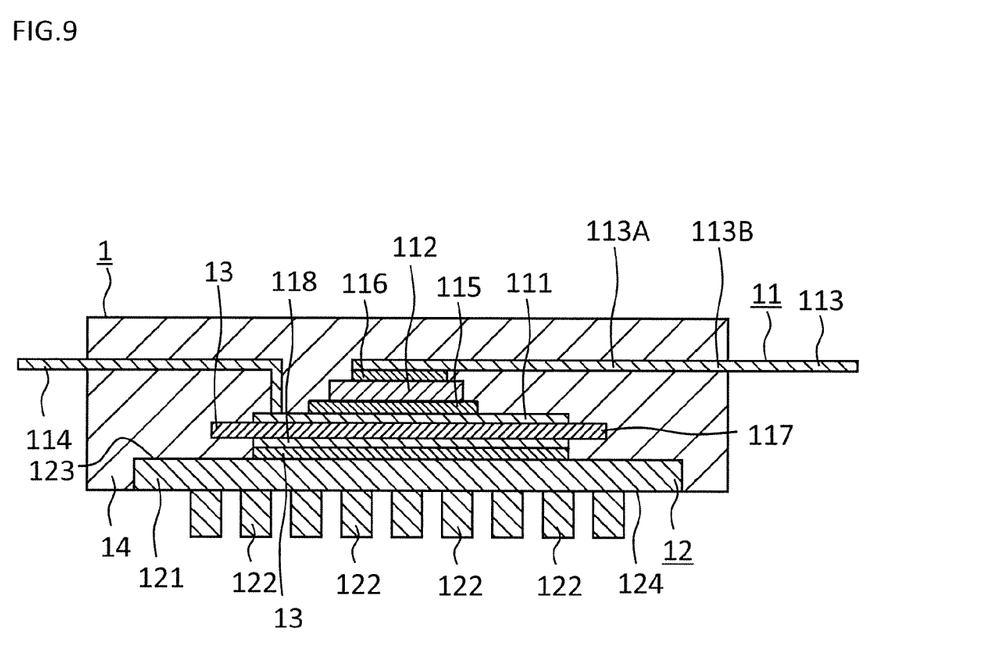
FIG. 9 is a sectional view for illustrating a main part of a power module manufactured by a manufacturing method for a power module according to a second embodiment of this invention.

FIG. 9 is a sectional view for illustrating a main part of a power module manufactured by a manufacturing method for a power module according to a second embodiment of this invention. In FIG. 9, the water jacket 15 is not illustrated. The subassembly 11 further includes an insulation member 117 and a copper plate 118. The insulation member 117 is made of, for example, ceramic.

The first electrode 111 is formed of, for example, a copper plate. The first electrode 111 and the insulation member 117 are joined to each other by brazing. The insulation member 117 and the copper plate 118 are joined to each other by brazing.

The copper plate 118 is joined to the first surface 123 of the flat-plate portion 121 of the heat sink 12 via the joining material 13. The joining material 13 is made of a material having a high thermal conductivity. Further, the joining material 13 is made of a sintered material. Examples of the sintered material include Ag nanoparticles and Cu nanoparticles. The Ag nanoparticles and the Cu nanoparticles can be subjected to low-temperature sintering.

The joining material 13 is sintered with the pressure of the resin and the heat of the resin at the time of injection of the resin into the inner side of the molding die 2. The sintering of the joining material 13 causes the copper plate 118 and the flat-plate portion 121 of the heat sink 12 to be joined to each other. Other configurations are the same as those of the first embodiment.

As described above, in the power module 1 and the manufacturing method therefor according to the second embodiment of this invention, the joining material 13 is made of a sintered material. Accordingly, as compared to the case in which the joining material 13 is formed of an adhesive sheet, the strength of joining between the subassembly 11 and the heat sink 12 can be improved. As a result, longer lifetime of the power module 1 can be achieved.

Third Embodiment

Figure 10:
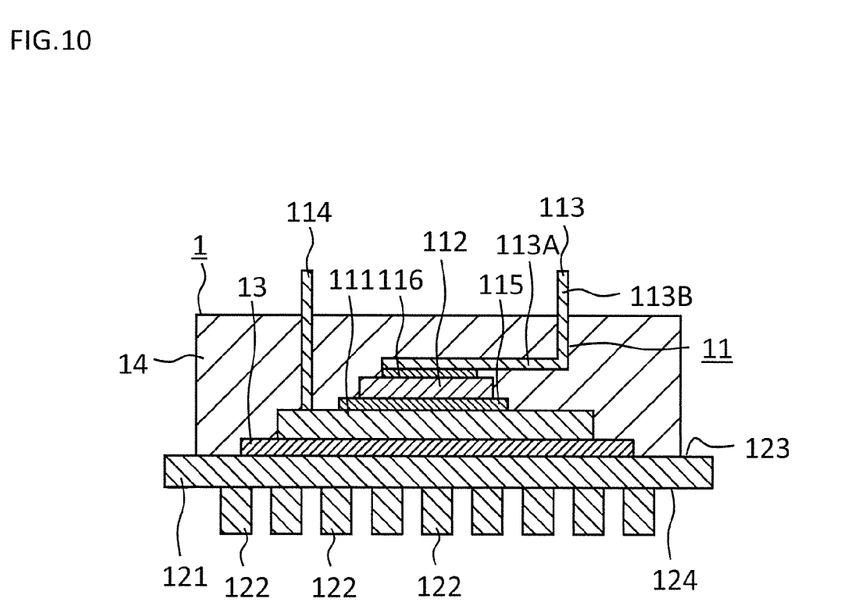
FIG. 10 is a sectional view for illustrating a main part of a power module manufactured by a manufacturing method for a power module according to a third embodiment of this invention.

FIG. 10 is a sectional view for illustrating a main part of a power module manufactured by a manufacturing method for a power module according to a third embodiment of this invention. In FIG. 10, the water jacket 15 is not illustrated. The second-electrode outer portion 113B of the second electrode 113 extends in a direction perpendicular to the flat-plate portion 121 of the heat sink 12 from the resin portion 14. The third electrode 114 extends in a direction perpendicular to the flat-plate portion 121 of the heat sink 12 from the resin portion 14. The resin portion 14 is molded integrally with the first surface 123 of the heat sink 12. The resin portion 14 is not molded integrally with the side surface of the heat sink 12.

Figure 11:
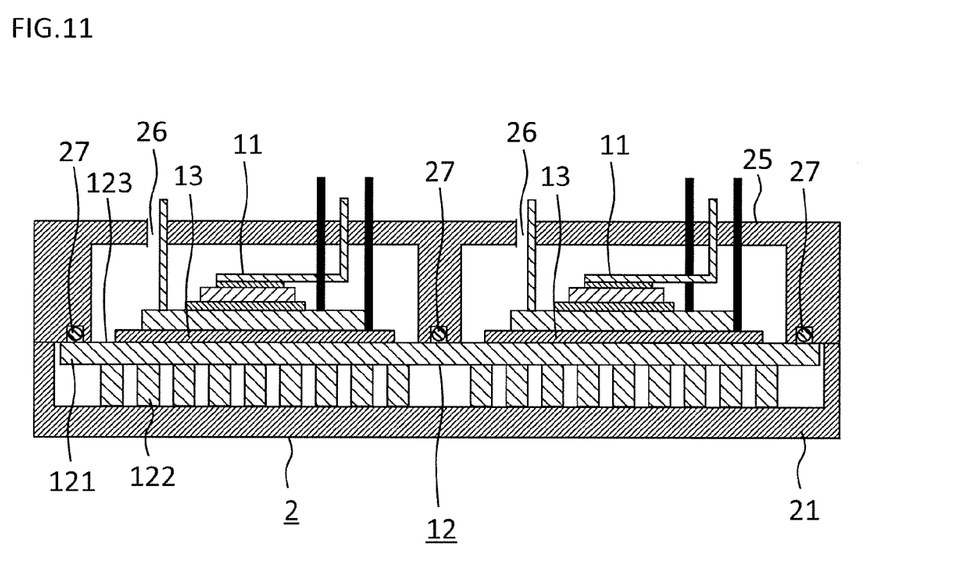
FIG. 11 is a sectional view for illustrating a state in which a subassembly, a joining material, and a heat sink of FIG. 10 are arranged on an inner side of a molding die.

FIG. 11 is a sectional view for illustrating a state in which the subassembly 11, the joining material 13, and the heat sink 12 of FIG. 10 are arranged on the inner side of the molding die 2. In the subassembly arranging step, one heat sink 12 is arranged on the lower die 21 of the molding die 2, and a plurality of subassemblies 11 are placed on the first surface 123 of the flat-plate portion 121 of the heat sink 12 via the joining materials 13. In FIG. 11, two subassemblies 11 are illustrated. However, in this example, six subassemblies 11 are placed on the first surface 123 of the flat-plate portion 121 of one heat sink 12 via the joining materials 13.

Further, in the subassembly arranging step, a fourth sealing member 27 is arranged between the upper die 25 of the molding die 2 and the peripheral edge portion of the first surface 123 of the flat-plate portion 121 of the heat sink 12. In such a manner, a part between the peripheral edge portion of the first surface 123 and the molding die 2 is sealed. The upper die 25 of the molding die 2 has six rooms corresponding to the six subassemblies 11, respectively. The number of the subassemblies 11 is not limited to six, and it is only required that a plurality of subassemblies 11 be provided. Other configurations are the same as in the first embodiment or the second embodiment.

As described above, according to the manufacturing method for the power module 1 according to the third embodiment of this invention, in the transfer molding step, the plurality of subassemblies 11 are separately joined to the heat sink 12 via the joining materials 13. The upper die 25 of the molding die 2 has a plurality of rooms corresponding to the plurality of subassemblies 11, respectively. When the entirety of the plurality of subassemblies 11 is covered by one resin portion 14, the amount of resin to be used at the time of forming the resin portion 14 becomes larger. Further, due to the difference in the linear expansion coefficient between the heat sink 12 and the resin portion 14, significant warping of the resin portion 14 occurs. Meanwhile, in the manufacturing method for the power module 1 according to the third embodiment, the plurality of subassemblies 11 are covered by separate resin portions 14, respectively. In other words, a plurality of separate resin portions 14 corresponding respectively to the plurality of subassemblies 11 are molded integrally with the heat sink 12. Accordingly, the amount of resin to be used at the time of forming the resin portions 14 can be reduced. Further, the size of the resin portion 14 can be reduced, thereby being capable of preventing occurrence of warping of the resin portion 14. Further, in the power module 1 according to the third embodiment of this invention, the plurality of subassemblies 11 are separately joined to the heat sink 12 via the joining materials 13, and the plurality of separate resin portions 14 are molded integrally with the heat sink 12. Accordingly, the amount of resin to be used at the time of forming the resin portions 14 can be reduced, and occurrence of warping of the resin portion 14 can be prevented.

REFERENCE SIGNS LIST 1 power module, 2 molding die, 11 subassembly, 12 heat sink, 13 joining material, 14 resin portion, 15 water jacket, 16 second sealing member, 21 lower die, 22 first sealing member, 23 first pin, 24 second pin, 25 upper die, 26 gate, 27 fourth sealing member, 101 U-phase upper arm, 102 U-phase lower arm, 103 V-phase upper arm, 104 V-phase lower arm, 105 W-phase upper arm, 106 W-phase lower arm, 111 first electrode, 112 semiconductor device, 113 second electrode, 113A second-electrode inner portion, 113B second-electrode outer portion, 114 third electrode, 115 first joining material, 116 second joining material, 117 insulating member, 118 copper plate, 121 flat-plate portion, 122 heat radiation fin, 123 first surface, 124 second surface, 151 frame, 152 tub portion, 153 third sealing member, 154 through hole.

The invention claimed is:

1. A power module, comprising:
   a subassembly including:
      a first electrode;
      a semiconductor device joined to the first electrode; and
      a second electrode joined to the semiconductor device;
   a heat sink to which the subassembly is joined via a joining material; and
   a resin portion molded integrally with the first electrode, the semiconductor device, a second-electrode inner portion being a portion of the second electrode joined to the semiconductor device, and the heat sink; and
   a water jacket joined to the heat sink,
   wherein the water jacket includes:
      a frame having a plurality of through holes; and
      a tub portion joined to the frame, and
   wherein, under a state in which a plurality of heat sinks are inserted into the plurality of through holes, respectively, each of the plurality of heat sinks and the water jacket are joined to each other.

2. The power module according to claim 1,
   wherein the heat sink includes a flat-plate portion having a first surface on which the subassembly is placed via the joining material, and
   wherein the resin portion is molded integrally with the first surface of the heat sink.

3. The power module according to claim 1,
   wherein the heat sink includes a flat-plate portion having a first surface on which the subassembly is placed via the joining material, and
   wherein the resin portion is molded integrally with the first surface and a side surface of the heat sink.

4. The power module according to claim 1, wherein the joining material is a semi-cured thermosetting resin.

5. The power module according to claim 1, wherein the joining material has a film-like shape or a sheet-like shape.

6. The power module according to claim 1, wherein the second electrode and the semiconductor device are joined to each other by wire bonding.

7. The power module according to claim 1, wherein the second electrode and the semiconductor device are joined to each other with use of solder.

8. The power module according to claim 1, wherein the joining material is made of a sintered material.

9. The power module according to claim 1,
wherein a plurality of subassemblies are separately joined to the heat sink via the joining material, and
wherein a plurality of separate resin portions corresponding to the plurality of subassemblies are molded integrally with the heat sink.

10. A manufacturing method for a power module, comprising:
a subassembly arranging step of placing a subassembly including a first electrode, a semiconductor device joined to the first electrode, and a second electrode joined to the semiconductor device on a heat sink via a joining material; and
a transfer molding step of, after the subassembly arranging step, under a state in which the first electrode, the semiconductor device, and a second-electrode inner portion being a portion of the second electrode joined to the semiconductor device are arranged in a region surrounded by the heat sink and a molding die, injecting a thermoplastic resin into the region,
wherein, in the transfer molding step, the subassembly is joined to the heat sink via the joining material with use of the resin,
wherein, in the transfer molding step, a second pin abuts against at least two or more pin abutment portions formed on the joining material so that the joining material is positioned with respect to the heat sink.

11. The manufacturing method for a power module according to claim 10, wherein, in the transfer molding step, a first pin pushes the first electrode toward the heat sink so that the first electrode is positioned with respect to the heat sink.

12. The manufacturing method for a power module according to claim 10, wherein the two or more pin abutment portions are two or more side surfaces formed on the joining material.

13. The manufacturing method for a power module according to claim 10, wherein the two or more pin abutment portions are two or more holes formed in the joining material.

* * * * *